(12) United States Patent
Takayama (10) Patent No.: US 7,535,509 B2
(45) Date of Patent: May 19, 2009

(54) TRANSPARENT MEMBER IN A SOLID-STATE IMAGE PICK-UP APPARATUS SUPPORTED THROUGH USE OF MICRO-LENSES LARGER IN SIZE THAN PIXEL MICRO-LENSES AND A METHOD FOR PRODUCING THE MICRO-LENSES AND TRANSPARENT MEMBER

(75) Inventor: Jun Takayama, Tama (JP)

(73) Assignee: Konica Minolta Opto, Inc., Hachioji-Shi (JP)

( * ) Notice: Subject to any disclaimer, the term of this patent is extended or adjusted under 35 U.S.C. 154(b) by 703 days.

(21) Appl. No.: 10/914,952

(22) Filed: Aug. 10, 2004

(65) Prior Publication Data
US 2005/0041134 A1   Feb. 24, 2005

(30) Foreign Application Priority Data
Aug. 22, 2003   (JP) .............................. 2003-298418

(51) Int. Cl.
  *H04N 5/225*   (2006.01)
  *G02B 27/10*   (2006.01)
  *H01L 31/062*  (2006.01)
  *H01L 31/113*  (2006.01)

(52) U.S. Cl. ........................ 348/340; 348/374; 359/619; 257/294

(58) Field of Classification Search ................. 348/335, 348/340, 373–6; 359/619–624; 257/290–1, 257/294
See application file for complete search history.

(56) References Cited

U.S. PATENT DOCUMENTS

| 5,119,235 | A | * | 6/1992 | Umeda et al. ............... 359/619 |
| 5,177,637 | A | * | 1/1993 | Tsukada .................... 359/599 |
| 6,744,109 | B2 | * | 6/2004 | Barton et al. ............... 257/436 |
| 2002/0195546 | A1 | * | 12/2002 | Yamaguchi et al. ........ 250/214.1 |
| 2004/0032523 | A1 | * | 2/2004 | Hartlove et al. ............. 348/340 |

FOREIGN PATENT DOCUMENTS

| JP | 48-053741 | 7/1973 |
| JP | 3190166 | 8/1991 |
| JP | 5-002151 | 1/1993 |
| JP | A H05-110960 | 4/1993 |

(Continued)

OTHER PUBLICATIONS

English Abstract of JP 2001-074913 published Mar. 23, 2001.*

(Continued)

*Primary Examiner*—Sinh N Tran
*Assistant Examiner*—Daniel M Pasiewicz
(74) *Attorney, Agent, or Firm*—Cohen Pontani Lieberman & Pavane LLP (57) ABSTRACT

A solid-state image pickup apparatus includes a light receiving pixel group having light receiving pixels to convert photoelectrically incident light and to be two-dimensionally arranged; a microlens array to be two-dimensionally arranged to correspond in position to the light receiving pixels; a transparent member to be arranged on a light entering side of the microlens array; and a protrusion to support the transparent member, wherein the protrusion is higher than the microlens array and is formed to be integrated with the microlens array.

17 Claims, 7 Drawing Sheets

FOREIGN PATENT DOCUMENTS

| | | | |
|---|---|---|---|
| JP | 2001-074913 | * | 3/2001 |
| JP | A 2003-031782 | | 1/2003 |
| JP | 2003-114316 | | 4/2003 |

OTHER PUBLICATIONS

International Preliminary Report (English translation) dated May 8, 2006 issued for the underlying International PCT Application No. PCT/JP2004/011731.

Written Opinion of the International PCT Application for the corresponding Japanese application.

International Preliminary Report (English translation) dated May 8, 2006 issued for the underlying International PCT Application No. PCT/JP2004/011731.

Written Opinion of the International PCT Application for the corresponding Japanese application, dated May 8, 2006.

* cited by examiner

TRANSPARENT MEMBER IN A SOLID-STATE IMAGE PICK-UP APPARATUS SUPPORTED THROUGH USE OF MICRO-LENSES LARGER IN SIZE THAN PIXEL MICRO-LENSES AND A METHOD FOR PRODUCING THE MICRO-LENSES AND TRANSPARENT MEMBER

BACKGROUND OF THE INVENTION

The present invention relates to an image pick-up device used for a camera, and in particular, to a solid-state image pick-up device suitable for a thin camera unit that is housed in a mobile terminal.

A small and thin image pick-up device has come to be housed in a small and thin electronic equipment such as a cellphone and PDA (Personal Digital Assistant). Owing to this, it has become possible to transmit not only voice information but also image information mutually to a remote place.

As an image sensor to be used in these image pick-up devices, there are used solid-state image sensors such as a CCD (Charge Coupled Device) type image sensor and a CMOS (Complementary Metal-Oxide Semiconductor) type image sensor.

In these image sensors, some ways are devised by forming a micro-lens on each light-receiving pixel to compensate for a fall of sensitivity caused by reduction of an area of light-receiving pixels resulted from downsizing and higher number of pixels.

On the other hand the image pick-up device stated above is required to be extremely thin because of a tendency of the equipment to be housed to be thin, and it is difficult to meet this requirement if conventional ceramic packages or resin mold packages are used. Therefore, it has been general to make the image pick-up device to be small in size and to be thin in thickness by packaging a semiconductor image sensor chip on which a micro-lens is formed, as it is, in a printed-circuit board constituting an image pick-up device, and then, by assembling an optical system to unite it.

In this case, if dust sticks to the micro-lens in the course of the process, rays of light to a light-receiving pixel are intercepted, causing sometimes problems that image data of a subject are interfered.

For this problem, there is proposed a solid-state image pick-up device wherein an image sensor is packaged while it is kept to be thin.

As examples for this, there are disclosed a solid-state image pick-up device wherein a layer whose refractive index is lower than that of a micro-lens is formed on a micro-lens array, and a transparent plate is arranged on the layer having the low refractive index, and a solid-state image pick-up device wherein a transparent plate is arranged on a micro-lens array through a spacer, and a space between the micro-lens array and the transparent plate is made to be an air layer (for example, see Patent Document 1).

(Patent Document 1) TOKKAI No. 2003-31782

The solid-state image pick-up device described in the Patent Document 1 has an advantage that dust does not stick to a micro-lens even when various processes have passed, and even when dust sticks to a transparent plate, the dust can be wiped off easily, because a micro-lens array portion is covered by the transparent plate for the period from the initial stage of the process to the completion of the image pick-up device, to be isolated from the open air.

However, in the method to form a layer having a low refractive index on a micro-lens array, there are problems that a layer thickness control for the layer having a low refractive index is difficult, and a process to form a layer having a low refractive index needs to be added, resulting in cost increase.

In the method to arrange a transparent plate on a micro-lens array through a spacer, a process to form a spacer, or a spacer member and incorporating thereof need to be added, and a similar cost increase is caused accordingly, which is a problem.

SUMMARY OF THE INVENTION

In view of the problems mentioned above, an object of the invention is to provide a solid-state image pick-up device wherein a solid-state image sensor is packaged without increasing processes for manufacturing, namely, at low cost, while keeping a thin type, an image pick-up device equipped with the solid-state image pick-up device and a method of manufacturing a micro-lens array of the solid-state image pick-up device.

The problems mentioned above are solved by the following measures.

A solid-state image pickup device having therein a group of light-receiving pixels, a micro-lens array and a transparent member arranged on the light incidence side of the micro-lens array, wherein protrusion portions higher than the micro-lens array are formed to be integrated with the micro-lens array solidly, and the transparent member is supported by the protrusion portions.

BRIEF DESCRIPTION OF THE DRAWINGS

Each of FIG. 1(a)

Each of FIGS. 6(a), 6(b), 6(c) and 6(d) is a schematic view of the method to form simultaneously a micro-lens array related to the invention and protrusion portions integrally and solidly.

DETAILED DESCRIPTION OF THE PREFERRED EMBODIMENT

Preferred structures and a manufacturing method of the invention will be explained as follows.

A solid-state image pick-up device described in Item 1 has therein a group of light-receiving pixels wherein light-receiving pixels converting incident light photoelectrically are arranged on a two-dimensional basis, a micro-lens array arranged on a two-dimensional basis corresponding to the light-receiving pixels stated above, and a transparent member to be arranged on the light incidence side of the micro-lens array, and protrusion portions higher than the micro-lens array are formed to be integrated with the micro-lens array, and the transparent member is supported by the protrusion portions.

A solid-state image pick-up device described in Item 2 is represented by the solid-state image pick-up device described in Item 1 wherein the protrusion portions are formed to be integrated with the micro-lens array solidly in one process.

A solid-state image pick-up device described in Item 3 is represented by the solid-state image pick-up device described in Item 1 wherein the process is conducted by a lithography technique.

A solid-state image pick-up device described in Item 4 is represented by the solid-state image pick-up device described in Item 3 wherein the process using a lithography technique is a process of forming the protrusion portions higher than the micro-lens array to be integrated with the micro-lens array by making a pattern used for exposure on the micro-lens array area to be different from that on an area other than the aforesaid area, in the case of exposure on the transparent thermoplastic and photosensitive resin film stated above in a method of manufacturing the micro-lens array for use in the solid-state image pickup device.

A solid-state image pick-up device described in Item 5 is represented by the solid-state image pick-up device described in Item 4 wherein the transparent photosensitive resin film is formed by a process using coating method.

A solid-state image pick-up device described in Item 6 is represented by the solid-state image pick-up device described in Item 4 wherein the exposed transparent photosensitive resin film is developed by an etching.

A solid-state image pick-up device described in Item 7 is represented by the solid-state image pick-up device described in Item 4 wherein the microlens array and the protrusion film are formed by a process using heat reflow method or etchback method.

A solid-state image pick-up device described in Item 8 is represented by the solid-state image pick-up device described in any one of Item 1-Item 7 wherein the protrusion portions are arranged in a way to surround the micro-lens array.

A solid-state image pick-up device described in Item 9 is represented by the solid-state image pick-up device described in any one of Item 1-Item 8 wherein the transparent member is stuck to be in contact with the protrusion portions, to seal up the micro-lens area.

A solid-state image pick-up device described in Item 10 is represented by the solid-state image pick-up device described in any one of Item 1-Item 9 wherein the transparent member serves as a molding member.

A solid-state image pick-up device described in Item 11 is represented by the solid-state image pick-up device described in any one of Item 1-Item 10 wherein the transparent member has an infrared blocking function.

A solid-state image pick-up device described in Item 12 is represented by the solid-state image pick-up device described in any one of Item 1-Item 11 wherein the protrusion lacking portion is prepared in the area of protrusion portions, and an engagement portion that engages with the protrusion lacking portion is formed on the transparent member.

A solid-state image pick-up device described in Item 13 is represented by the solid-state image pick-up device described in any one of Item 1-Item 12 wherein recess portions or protrusion portions are formed on a part of the surface on the light incidence side of the transparent member.

A solid-state image pick-up device described in Item 14 is represented by the solid-state image pick-up device described in any one of Item 1-Item 13 wherein a light shielding portion is provided on the transparent member.

A solid-state image pick-up device described in Item 15 is represented by the solid-state image pick-up device described in any one of Item 1-Item 14 wherein an antireflection element is provided on at least one surface of the transparent member.

A solid-state image pick-up device described in Item 16 is represented by the solid-state image pick-up device described in any one of Item 1-Item 15 wherein an optical low-pass filter composed of diffraction gratings is provided on at least one surface of the transparent member.

A solid-state image pick-up device described in Item 17 is provided with the solid-state image pick-up device described in any one of Item 1-Item 16 and with an image pick-up optical system that forms images of light of an object on the solid-state image pick-up device.

A solid-state image pick-up device described in Item 18 is represented by the solid-state image pick-up device described in Item 17 wherein the image sensor is made to be in contact with the surface on the light incidence side of the transparent member.

A manufacturing method of a micro-lens array for a solid-state image pick-up device described in Item 19 is a manufacturing method of a micro-lens array for a solid-state image pick-up device that forms an array of micro-lenses arranged to correspond to light-receiving pixels of a group of light-receiving pixels where light-receiving pixels converting incident light photoelectrically are arranged on a two-dimensional basis, by giving exposure of a desired pattern on a thermoplastic and transparent photosensitive resin film, wherein protrusion portions higher than the micro-lens array are formed to be integrated with the micro-lens array by making a pattern used for exposure on the micro-lens array area to be different from that on an area other than the aforesaid area, in the case of exposure on the transparent photosensitive resin film stated above.

In the invention, protrusion portions are formed to be integrated with a micro-lens array when forming the micro-lens array, and a transparent member is supported by these protrusion portions, thus, it is possible to obtain a solid-state image pick-up device wherein a solid-state image sensor is packaged without increasing processes for manufacturing, namely, at low cost, while keeping a thin type.

Further, the protrusion portions are arranged to surround a group of light-receiving pixels, and these protrusion portions and the transparent member are stuck to each other, and thereby, the micro-lens portion can be sealed easily, and immersion of moisture and dust into the micro-lens portion can be prevented.

Further, by making the transparent member to serve as a molding member, accuracy of a thickness of the transparent member can be improved, and a light incidence surface side of the transparent member can be made to be a reference in the optical axis direction of the image pick-up optical system.

By making the transparent member to have an infrared blocking function, a thickness of an image pick-up device can be reduced.

It is further possible to position the transparent member simply on the image sensor by forming the protrusion lacking portion in the area of protrusion portions.

By forming recess portions or protrusion portions on the light incidence surface side of the transparent member, positioning in the direction perpendicular to the optical axis of the image pick-up optical system turns out to be simple.

Further, by providing a light shielding portion at the position other than the portion where image pick-up light flux is transmitted, on the transparent member, it is possible to intercept unwanted light that enters an image sensor, and to prevent a decline of contrast in images of a photographic object and thereby to improve image quality of the images of a photographic object.

Further, by conducting antireflection processing on the transparent member, it is possible to prevent a decline of contrast in images of a photographic object and thereby to improve image quality of the images of a photographic object.

Further, by providing an optical low-pass filter composed of diffraction gratings on the transparent member, it is possible to provide a double refraction optical element function, and to solve the problems of false colors and moirés without using a conventional crystal plate, which enables cost reduction and a thin apparatus.

It is possible to obtain an image pick-up device having the aforesaid effect by providing, on the image pick-up device, the solid-state image pick-up device and an image pick-up optical system that makes light of a photographic object to form an image.

By making an image pick-up device to be one wherein an image pick-up optical system is in contact with the surface on the light incidence surface side of the transparent member, it is possible to construct it by keeping the positional relationship between the solid-state image pick-up device and on image pick-up optical system to be accurate without dispersion.

In addition, by the manufacturing method of a micro-lens array for forming the micro-lens array of the invention and protrusion portions integrally at the same time, it is possible to obtain a solid-state image pick-up device wherein a solid-state image pick-up device is packaged at low cost.

The invention will be explained in detail as follows, referring to embodiments to which, however, the invention is not limited.

Incidentally, in the present embodiment, an explanation will be given under the assumption that a semiconductor image sensor chip having a group of light-receiving pixels in which light-receiving pixels each converting incident light photoelectrically are arranged on a two-dimensional basis is called an image sensor, a construction wherein a micro-lens and a transparent member are provided on the image sensor is called a solid-state image pick-up device and the solid-state image pick-up device that is provided with an image pick-up optical system to become a camera module form is called an image pick-up device.

FIRST EMBODIMENT

First Embodiment of the invention will be explained as follows. The First Embodiment is an image pick-up device wherein image sensors are packaged in a printed-circuit board through the so-called flip-chip packaging method.

Figure 1A:
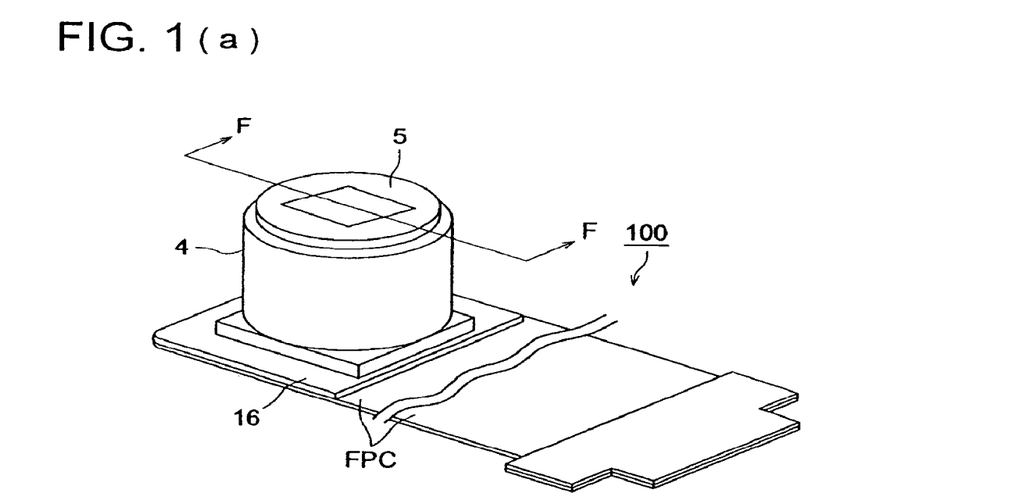
Figure 1B:
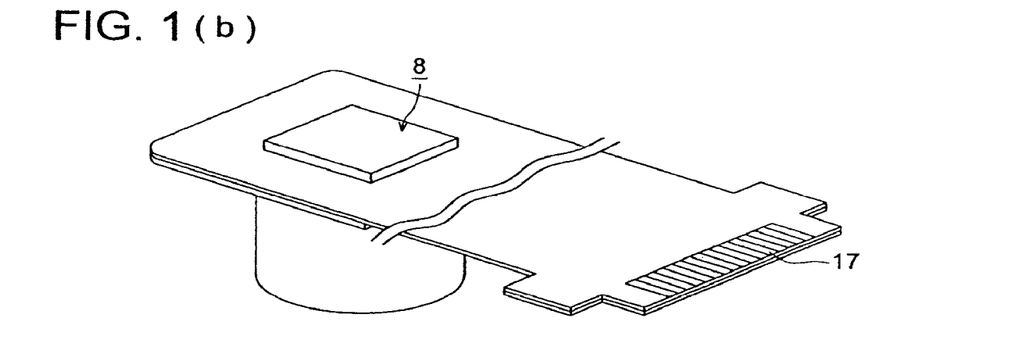
FIG. 1(b) is a perspective view of image pick-up device 100 in the present embodiment.

FIGS. 1(a) and 1(b) are a perspective views of image pick-up device 100 in the present embodiment. FIG. 1(a) is a perspective view of an image pick-up device that is viewed from the light incidence side representing the surface of the front side, and FIG. 1(b) is a perspective view of the image pick-up device that is viewed from the image sensor side.

As shown in FIG. 1(a), outer frame member 4 that houses therein an optical member and a cover member 5 having an aperture portion on the light incidence side of the outer frame member are provided on the front side of the image pick-up device 100, through flexible printed-circuit board FPC and through reinforcement plate 16 attached on the flexible printed-circuit board FPC.

As shown in FIG. 1(b), solid-state image pick-up device 8 relating to the invention is connected electrically to the other side of the flexible printed-circuit board FPC to be stuck thereto, on the reverse side of the image pick-up device 100, through the flip-chip packaging method. Photoelectrically converged signals coming from the solid-state image pick-up device 8 and signals for controlling the solid-state image pick-up device 8 are capable of being inputted and outputted mutually through the flexible printed-circuit board FPC, with connection terminal portion 17 connected with a base board on an unillustrated mobile terminal main body side.

Figure 2:
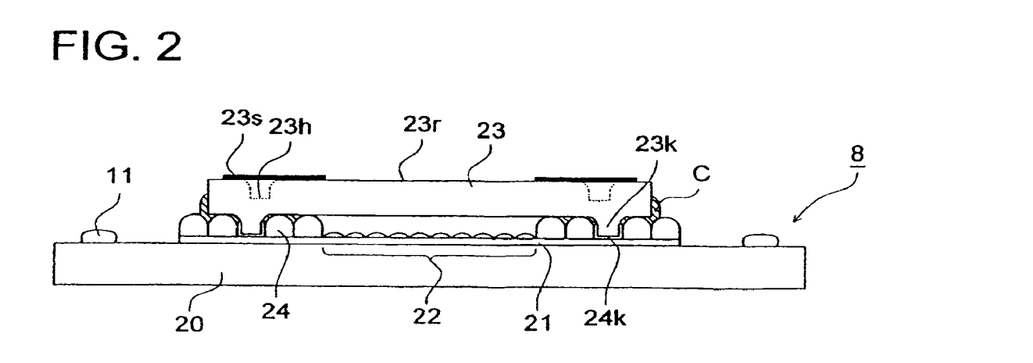
FIG. 2 is a sectional side view of a solid-state image pick-up device that is related to the invention and is used in the image pick-up device 100.

FIG. 2 is a sectional side view of solid-state image pick-up device 8 relating to the invention used for image pick-up device 100.

As shown in FIG. 2, the solid-state image pick-up device 8 is composed of semiconductor image sensor chip 20 having therein a group of light-receiving pixels (not shown) in which light-receiving pixels each converting incident light photoelectrically are arranged on a two-dimensional basis and mosaic color filter layer 21 arranged on a two-dimensional basis corresponding to light-receiving pixels, micro-lens array 22 arranged on a two-dimensional basis corresponding to light-receiving pixels and of transparent member 23 arranged on the light incidence side of the microlens array 22.

Protrusion portions 24 which are higher than micro-lens array 22 are formed on the surrounding area of the micro-lens array 22 in the same process for forming the micro-lens array 22 simultaneously to be solid with the micro-lens array 22. Lithography technique can be used for the process. Transparent member 23 is supported to be in contact with the protrusion portions 24. Owing to this, an air layer is allowed to be present between the micro-lens array 22 and the transparent member 23, thus, the refracting power of the micro-lens array 22 is secured. Incidentally, though the air layer is most advantageous in terms of performance, transparent optical material whose refractive index is lower than that of the micro-lens array 22 may also be filled.

At least two portions each being protrusion lacking portion 24k having no protrusion portion are formed in an area of the protrusion portions 24. Protruded portions 23k are formed on the transparent member 23 to be positioned at locations corresponding to the protrusion lacking portion 24k, and the transparent member 23 is positioned when the protruded portions 23k of the transparent member 23 are engaged with the protrusion lacking portion 24k. After this positioning is completed, a circumference of the protrusion portions 24 and that of the transparent member 23 are stuck each other with adhesives C of a UV curing type, for example, and thereby, a space on the light incidence side of the micro-lens array 22 is sealed by the transparent member 23 and the protrusion portions 24.

For example, the known infrared blocking coating having an infrared blocking function is performed on light incidence side 23*r* of the transparent member 23, and light shielding printing with black colored 23*s*, for example, is performed on the portion other than an area where a light flux of the photographic object coming from the image pick-up optical system is transmitted. By doing this, it is possible to reduce a thickness of a member for blocking infrared rays, and light shielding printing intercepts unwanted light entering the image sensor, thus, a decline of contrast in images of a photographic object can be prevented, and image quality of images of a photographic object can be improved.

Incidentally, it is preferable to conduct antireflection processing on the transparent member 23. Due to this, a decline of contrast in images of a photographic object can be prevented, and image quality of images of a photographic object can be improved.

As the antireflection processing, it is preferable to conduct antireflection described in TOKKAI No. 2003-114316 by forming a shape of arranged minute cones and pyramids and by setting the pitch of them at random so that diffracted light having order numbers other than zero at the incidence side and the emergence side for light with a critical wavelength or with a higher wavelength may be zero substantially.

By doing this, a process of coating can be omitted and a cost reduction can be realized accordingly, because antireflection processing can be performed by the molding.

In addition, it is preferable to form an optical low-pass filter composed of diffraction gratings on at least one surface of the transparent member 23 to make it to have the function which is the same as that of the double refraction optical element. This optical low-pass filter composed of diffraction gratings is one in a shape of gratings whose grating pitch and its depth are determined depending on a distance between a plane of gratings and a plane of image sensors and on a desired cut-off frequency, such as those described in TOKKAIHEI No. 5-2151, TOKKOSHO No. 49-20105 and TOKKAISHO No. 48-53741, for example.

Owing to this, the optical low-pass filter employing a crystal plate which has been used for an image pick-up device that has housed therein an image sensor with a high number of pixels is made to be unnecessary, which makes a cost reduction possible and realizes an apparatus that is thin in the optical axis direction.

Further, on the surface of light incidence side 23*r* of the transparent member 23, there are formed recessed portions 23*h* at plural locations.

As the transparent member 23, therefore, a molded member wherein a thickness can be controlled accurately, and the recess and protrusion forms for antireflection mentioned above, the diffraction gratings structure and the protruded portions 23*k* as well as the recessed portions 23*h* can be molded integrally, namely, a member molded through resin molding or glass molding, is preferable, and a cost reduction by integral molding can be realized.

Incidentally, in the present example explained above, two protrusion lacking portions are provided on the area of protrusion portions and two protruded portions for engagement are provided on the transparent member, for positioning. However, it is also possible to make the protrusion portions to be protrusion lacking portions in a form of a picture frame and to form the protruded portions to be in a form of a picture frame or in a form of two parallel lines, so that they may engage with each other for positioning.

Figure 3:
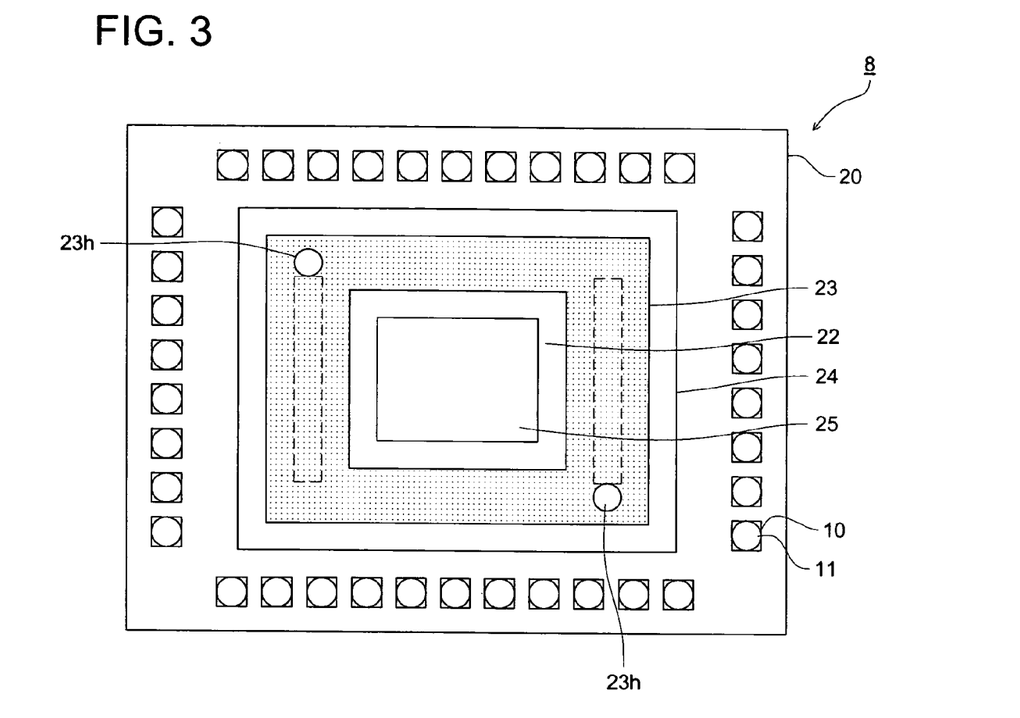
FIG. 3 is a front view in which a solid-state image pick-up device related to the invention is viewed from the light-receiving pixel side.

FIG. 3 is a front view of solid-state image pick-up device 8 relating to the invention viewed from the plane of light-receiving pixels. In the following drawings, same members are given the same symbols to avoid reduplication of the explanation.

As shown in FIG. 3, on the outer peripheral portions of semiconductor image sensor chip 20 in the solid-state image pick-up device 8, there are provided electrode pads 10 in the prescribed number connected to the signal lines for transmitting signals from a light-receiving pixel and for controlling operations of the solid-state image pick-up device 8, and protruded electrode (bump) 11 is formed in each electrode pads 10.

On the central portion of the solid-state image pick-up device 8, there is formed light-receiving pixels group 25, and color mosaic filter layer 21 is formed on each of the light-receiving pixels. Further, there is formed a micro-lens corresponding to each of the light-receiving pixels. An area of micro-lens array 22 is formed to be broader than the area of the light-receiving pixels group 25. Further, protrusion portions 24 are formed integrally to surround the area of micro-lens array 22. On the protrusion portions 24, there is arranged transparent member 23 whose area is smaller than that of the protrusion portions 24.

Figure 4:
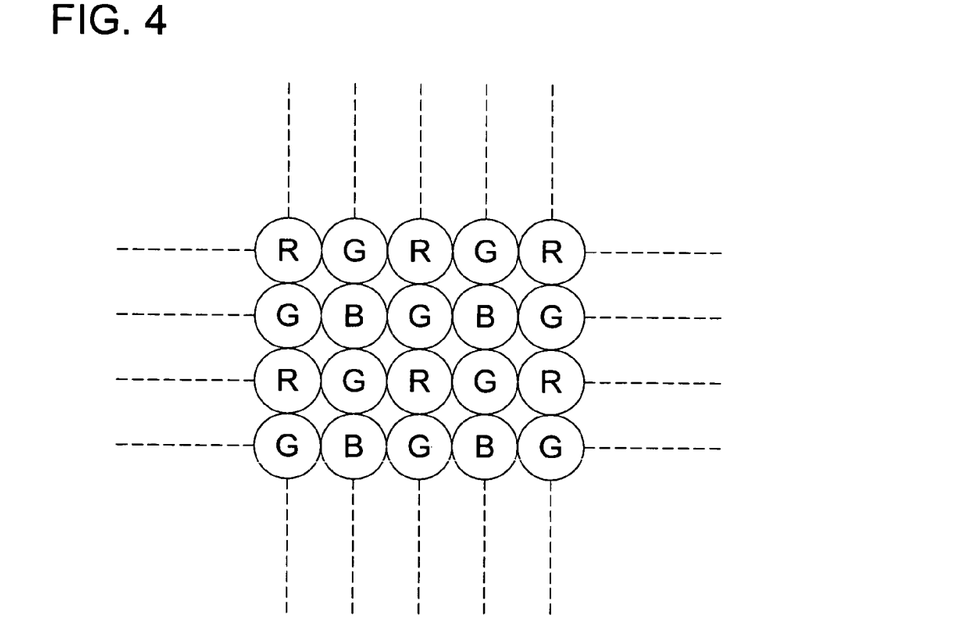
FIG. 4 is a diagram showing an example of an arrangement of a color mosaic filter formed on a solid-state image pick-up device.

FIG. 4 is a diagram showing an example of arrangement of color mosaic filters formed on the solid-state image pick-up device 8. FIG. 4 shows filter arrangement of a known elementary color system. Corresponding to each of light-receiving pixels, a line on which R (red) and G (green) are formed alternately in the direction of the long side of the group of light-receiving pixels and a line on which G and B (blue) are formed alternately are arranged alternately. Further, an arrangement is made so that G of the line for G and B may come under R of the line for R and G. Incidentally, the color mosaic filter may also be of the arrangement of another elementary color system, or it may be of the arrangement of a complimentary color system using Ye (yellow), Mg (magenta) and G (green).

Figure 5A:
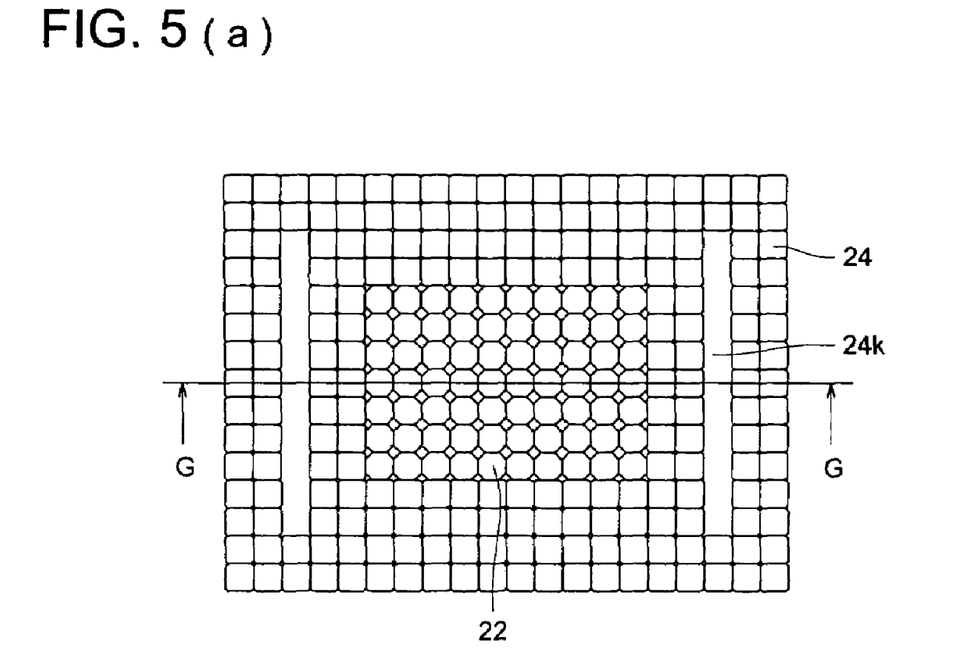
FIG. 5(a) is a schematic view of a micro-lens array formed on a solid-state image pick-up device.
Figure 5B:
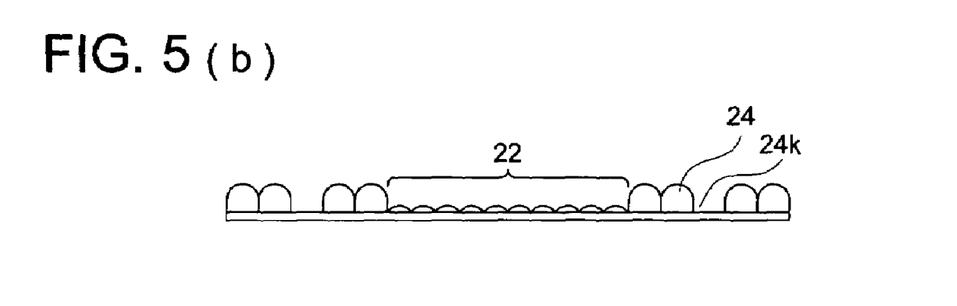
FIG. 5(b) is a schematic view of an example of protrusion portions and protrusion lacking portions.

FIGS. 5(*a*) and 5(*b*) are a schematic diagrams of an example of micro-lens array 22, protrusion portions 24 and protrusion lacking portions 24*k* which are formed on the solid-state image pick-up device 8. FIG. 5(*a*) is a front view, while, FIG. 5(*b*) is a sectional view taken on line G-G shown in FIG. 5(*a*).

As shown in FIGS. 5(*a*) and 5(*b*), micro-lens array 22 corresponding to light-receiving pixels on the central portion and protrusion portions 24 surrounding the area of the micro-lens array 22 are formed integrally. In the present example, two protrusion lacking portions 24*k* each being in a rectangular form are formed respectively at two locations in the area of protrusion portions 24. As explained earlier, the protrusion lacking portions 24*k* are used for positioning with transparent member 23.

FIGS. 5(*a*) and 5(*b*) are schematic diagrams for a method to form micro-lens array 22 and protrusion portions 24 both relating to the invention.

As a method of forming a micro-lens array, there are known a general heating and melting method(in other words, heat reflow method) and a method employing etch-back described in TOKKAIHEI No. 3-190166. In the invention, a method to form micro-lens array 22 and protrusion portions 24 integrally by using a heating and melting method will be explained in detail.

Figure 6:
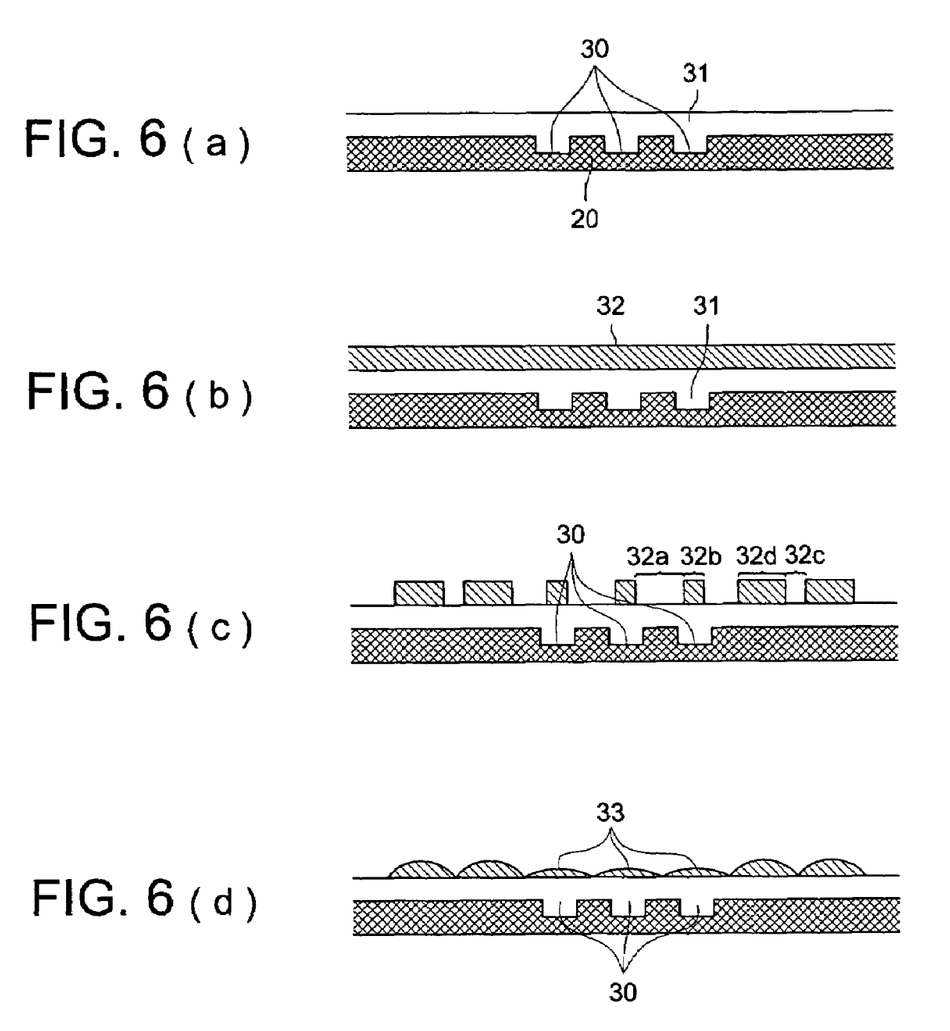

FIGS. 6(*a*)-6(*d*) show an order of processes, and these processes will be explained as follows.

(1) Light-receiving pixels 30 each converting light into electric charges are formed, and on semiconductor image sensor chip 20 on which the color filter(not shown) is formed on each of the light-receiving pixels, there is formed transparent film 31 whose surface is smoothed(FIG. 6(*a*)).

(2) Next, thermoplastic and transparent photosensitive resin film 32 is formed on the transparent film 31(FIG. 6(*b*)).

Coating technique can be used for the manufacturing method of the transparent photosensitive resin film.

(3) An exposure of the desired pattern is given to the transparent photosensitive resin film 32 thus formed. An occasion where the transparent photosensitive resin film 32 is a positive type photosensitive resin film as a pattern of exposure in this case, will be explained. On the area of light-receiving pixels 30, an exposure is given with a pattern including broad portion(transmission portion) 32a to be exposed and narrow portion(light shielding portion) 32b not to be exposed, while, on the area having no light-receiving pixels 30, an exposure is given with a pattern mask in a checkerboard pattern having narrow portion (transmission portion) 32c to be exposed and broad portion (light shielding portion) 32d not to be exposed. With respect to this exposure, the same exposure may be given by scanning with a laser beam. In the case of mass production, the former is preferable, and owing to this, exposure may be given to the portion of many semiconductor image sensors collectively on the semiconductor wafers, which is advantageous in terms of cost.

When development is conducted after the exposure of this kind, resin films on the exposed portion are removed in the case of the photosensitive resin film of a positive type, resulting in the state wherein resin films remaining on the light-receiving pixels 30 are small and those on the area of no light-receiving pixels 30 are large as shown in the drawing (FIG. 6(c)). The development can be conducted by etching process.

(4) After this, heating and melting are conducted so that remaining resin films may be fluidized to be formed in a shape of a lens. In this case, as shown in the drawing, lens 33 for which an amount of the remaining resin films is small is formed to be thin, and in the area having no light-receiving pixels 30 where an amount of remaining resin films is large, it is possible to form to be higher than lens 33 on the light-receiving pixels 30 (FIG. 6(d)).

With respect to the protrusion lacking portions, it is possible to eliminate resin films by giving exposure in a shape matching the protrusion lacking portion in the same way, and thereby to form as a protrusion lacking portion.

As stated above, in the case of giving exposure to a transparent photosensitive resin film, when a pattern to be exposed in the area of micro-lens array is made to be different from that in the area other than the aforesaid area, protrusion portions which are higher than the micro-lens array can be formed simultaneously and integrally with the micro-lens array, thus, it is possible to manufacture at low cost without increasing manufacturing processes.

Incidentally, this method can be applied also to the method employing etch-back by using the same pattern mask in the case of exposure. When photosensitive resin film of a negative type is used, a pattern mask that is opposite to the foregoing may be used.

An internal structure of image pick-up device employing the solid-state image pick-up device 8 formed in the aforesaid manner will be explained.

Figure 7:
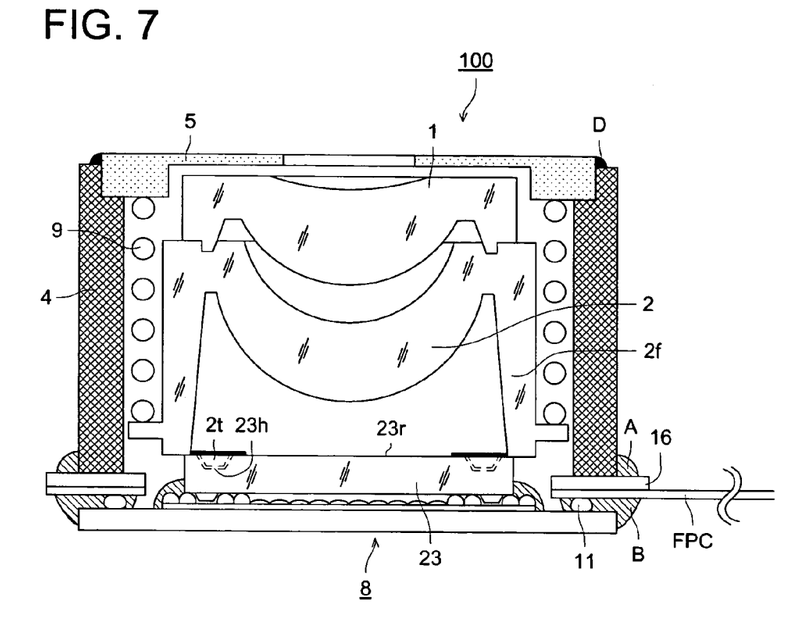
FIG. 7 is a schematic sectional view of image pick-up device 100 taken on line F-F shown in FIG. 1(a).

FIG. 7 is a schematic sectional view of image pick-up device 100 taken on line F-F shown in FIG. 1(a).

In FIG. 7, the inside of outer frame member 4 is composed of an image pick-up optical system having the first lens 1 and the second lens 2 in this order from the photographic object side, solid-state image pick-up device 8 related to the invention packaged on flexible printed-circuit board FPC, compression coil spring 9 representing an elastic member and cover member 5.

The image pick-up optical system is arranged to be incorporated with a minimum error of a lens distance between them through the structure wherein the first lens 1 and the second lens 2 are made to be in contact with each other on their flange portions other than an optical effective surface, and are stuck to each other with adhesives to be unitized, without using other members.

The image pick-up device 100 will be explained in accordance with the assembling order.

First, the solid-state image pick-up device 8 relating to the invention is connected electrically with flexible printed-circuit board FPC through protruded electrode(bump) 11, and its circumference is stuck, for example, with UV curing adhesives B and is sealed. On the flexible printed-circuit board FPC, there is stuck reinforcement plate 16 having an aperture portion in advance as reinforcement.

Next, after the position of a group of light-receiving pixels on the solid-state image pick-up device is confirmed by the positioning camera provided on a jig, the position of the outer frame member 4 is determined, and the outer frame member 4 is placed on the reinforcement plate 16, and its circumference is stuck and fixed by, for example, UV curing or rubber-based adhesives A.

Further, there is fabricated so that recessed portions 23h formed on light incidence side 23r of the solid-state image pick-up device 8 may engage with protruded portions 2t formed to be solid with the second lens 2. Due to this, positioning of the image pick-up optical system in the direction perpendicular to the optical axis is conducted. Further, an end portion of cylinder portion 2f that is formed to be solid with the second lens 2 comes in contact with the surface of light incidence side 23r of transparent member 23.

Incidentally, though recessed portions 23h were formed on the transparent member 23 and protruded portions 2t were formed on the second lens 2 so that the recessed portions and the protruded portions may engage with each other for positioning in the direction perpendicular to the optical axis, it is naturally possible to form the protruded portions on the transparent member 23 and to form the recessed portions on the second lens 2, on the contrary, so that the protruded portions and the recessed portions may engage with each other.

Next, compression coil spring 9 and cover member 5 are incorporated, and the cover member 5 is stuck to outer frame member 4 with adhesives D, thus, the second lens 2, namely, the image pick-up optical system is urged by the compression coil spring 9 to be brought into contact with the surface of light incidence side 23r of the transparent member 23. Owing to this, positioning of the image pick-up optical system in the optical axis direction is conducted.

As stated above, protrusion portions are formed simultaneously and integrally with a micro-lens array in the process of manufacturing the micro-lens array without dispersion in heights of protrusion portions, and a surface of a group of light-receiving pixels and a surface on the light incidence side of the transparent member can be formed without dispersion in their positions by supporting the transparent member with excellent accuracy in the direction of the thickness with the protrusion portions in the course of resin molding. By bringing the image pick-up optical system into contact with the surface on the light incidence side of the transparent member, it is possible to assemble while keeping the positional relationship between the surface of a group of light-receiving pixels and the optical axis direction of the image pick-up optical system to be accurate, and it is possible to assemble an image pick-up device which agrees with a desired subject distance in terms of focus without adjustment.

The foregoing represents schematic internal structures of solid-state image pick-up device 8 and image pick-up device 100 employing the solid-state image pick-up device 8.

Namely, in the solid-state image pick-up device of the invention, a micro-lens array portion is sealed by the transparent member in and after the initial stage of a manufacturing process of the image pick-up device. Therefore, it is possible to protect important portions in the solid-state image pick-up device from moisture and dust, and thereby, to restrain a decline of the yield rate caused by adhesion of dust in the manufacturing process to be minimum, which makes cost reduction possible.

SECOND EMBODIMENT

Second Embodiment of the invention will be explained as follows. The Second Embodiment is an example wherein the solid-state image pick-up device of the invention is formed to be an image pick-up device of a type of the so-called ball grid array.

Figure 8:
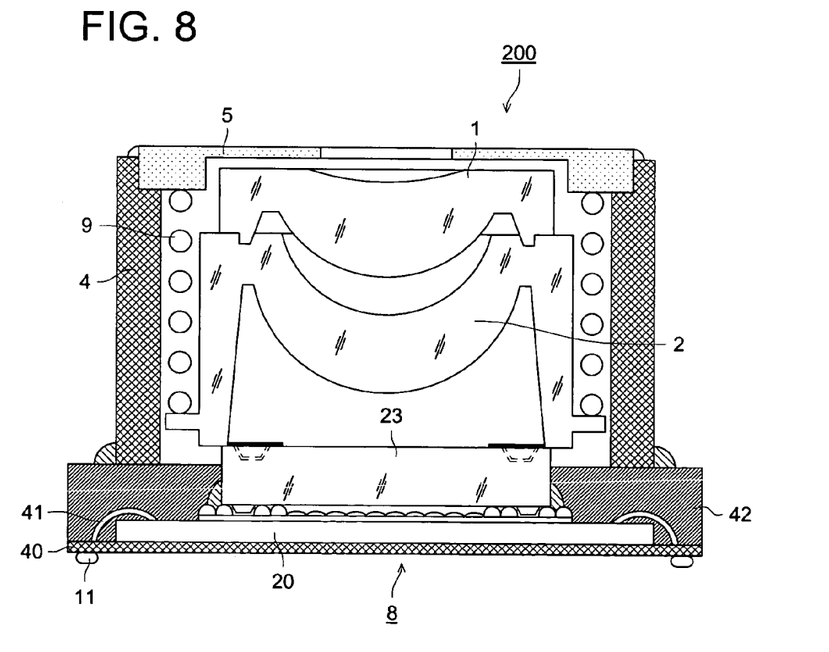
FIG. 8 is a schematic sectional view showing the internal structure of image pick-up device 200.

FIG. 8 is a schematic sectional view showing the internal structure of image pick-up device 200. Since structures of a color filter layer, a micro-lens array, protrusion portions united with the micro-lens array and a transparent member are the same as those in the explanation in FIG. 2 and FIG. 3, different portions will be explained.

In FIG. 8, the numeral 40 is a base board on which semiconductor image sensor chip 20 is arranged, and its outer edges are connected to an unillustrated connecting terminal of the base board 40 with the electrode pads in prescribed number which are connected with signal lines for transmitting signals coming from light-receiving pixels and for controlling operations of solid-state image pick-up device 8 through bonding wires 41. The base board 40 is connected with unillustrated electrode pads on the reverse side through through-holes at the circumference of each connection terminal, and bump 11 is formed on the electrode pad on the reverse side.

Under the condition that the solid-state image pick-up device 8 on which the transparent member 23 is stuck is arranged on the base board 40, and the base board 40 is connected to the electrode pad with bonding wire 41, resin portion 42 is formed by the method identical to the so-called insert molding. This can be manufactured through the method identical to the packaging such as PROM(Programmable Read Only Memory) of a UV eliminating type. Owing to this, dimensionally accurate packaging of the solid-state image pick-up device 8 in the resin portion 42 can be carried out.

By incorporating the outer frame member 4, an image pick-up optical system composed of the first lens 1 and the second lens 2, the compression coil spring 9 representing an elastic member and cover member 5, on the resin portion 42 of the solid-state image pick-up device 8 formed in the aforesaid manner, the image pick-up device 200 is completed.

The image pick-up device 200 is connected to the base board arranged on the part of a mobile terminal through bump 11. When the transparent member 23 is made of glass material, reflow soldering can also be used.

Figure 9:
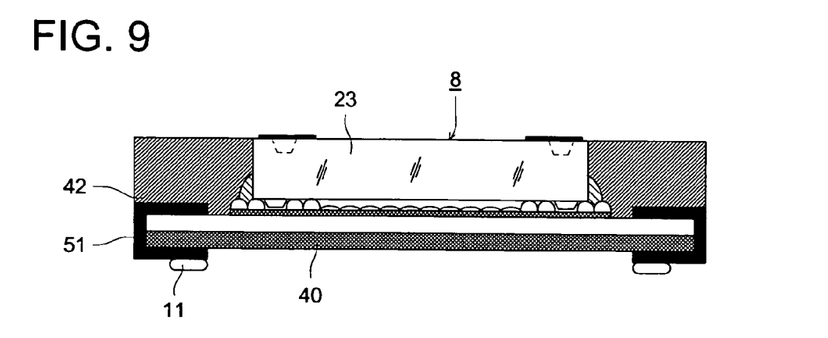
FIG. 9 shows another example of a solid-state image pick-up device formed on a ball-grid array type.

FIG. 9 shows another example of the solid-state image pick-up device formed to be of a ball grid array type. Since the structures of a color filter layer, a micro-lens array, protrusion portions which are united with the micro-lens array and of the transparent member are the same as those in the explanation in FIG. 2 and FIG. 3, they are omitted, and different portions will be explained by FIG. 9.

The solid-state image pick-up device 8 is arranged on the base board 40, then connection with the base board 40 by bonding wire 41 explained in FIG. 8 is not conducted, and a pattern is drawn out of the electrode pad on the solid-state image pick-up device 8 to the reverse side of the base board 40 by U-shaped connecting member 51. The bump 11 is formed on this connecting member 51. Since the method of forming the resin portion 42 and incorporating of the outer frame member, the image pick-up optical system, the compression coil spring and the cover member are the same as those in FIG. 8, these will be omitted.

Each of FIGS. 10-13 is a diagram showing another example of shapes of protrusion portions formed integrally with a micro-lens array.

Figure 10:
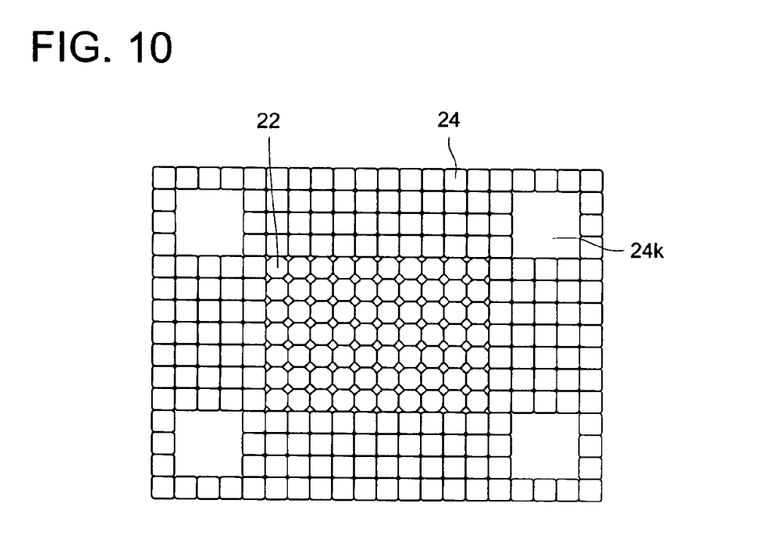
FIG. 10 is a diagram showing another example of a shape of protrusion portions formed to be solid with a micro-lens array.

Shapes of micro-lens array 22 shown in FIG. 10 and of protrusion portions formed integrally with the micro-lens array are those formed by the method identical to that in FIGS. 5(*a*) and 5(*b*). Four protrusion lacking portions 24*k* are formed in the diagonal direction in the area of protrusion portions 24. Protruded portions for positioning the transparent member are formed on the positions corresponding to these protrusion lacking portions 24*k*, for positioning.

Figure 11:
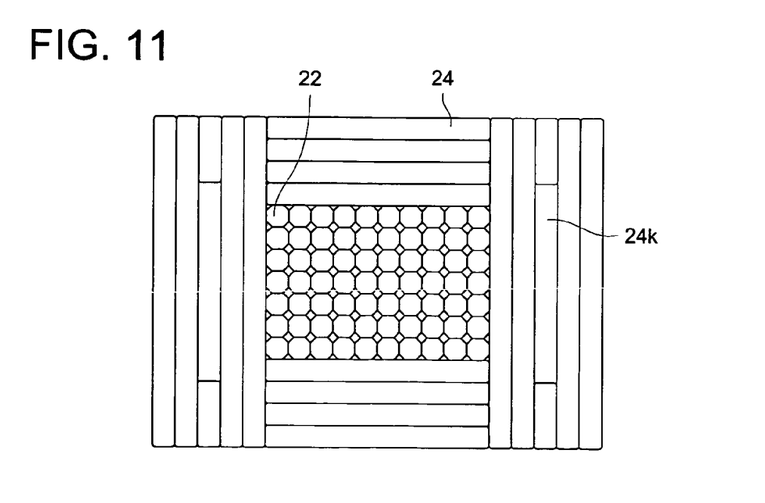
FIG. 11 is a diagram showing still another example of a shape of protrusion portions formed to be solid with a micro-lens array.

A shape of protrusion portion 24 shown in FIG. 11 is one in which a section is made to be a shape of a cylindrical lens. Protrusion lacking portion 24*k* is formed by eliminating the cylindrical lens shape by the aforesaid exposure. This cylindrical lens shape is effective for preventing immersion of excessive adhesives to the inside micro-lens array 22, in the case of sticking the transparent member.

Figure 12:
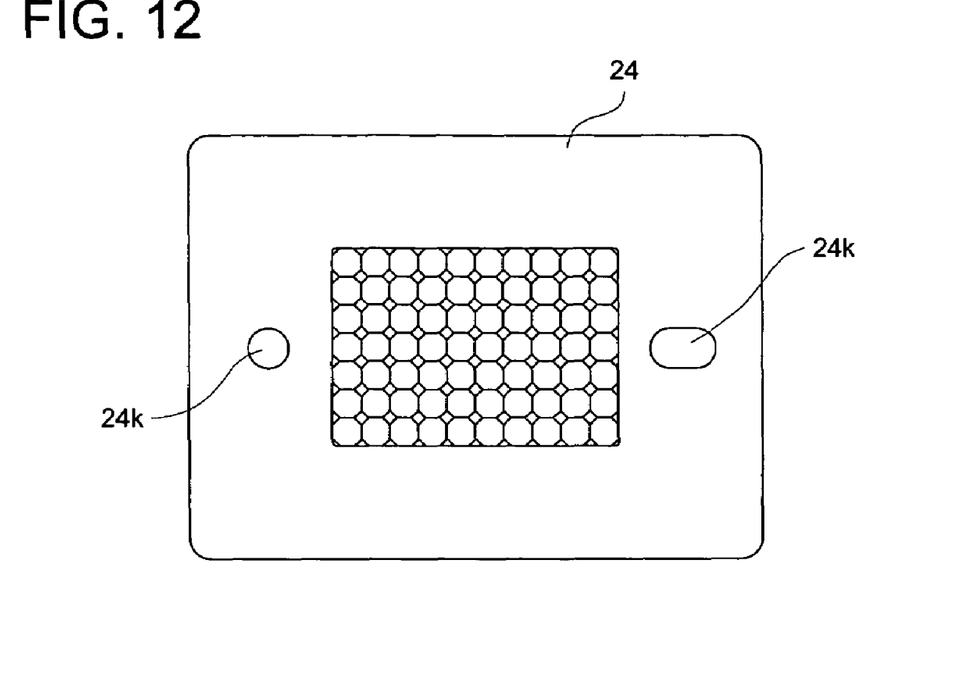
FIG. 12 is a diagram showing still another example of a shape of protrusion portions formed to be solid with a micro-lens array.

The shape of protrusion portion 24 shown in FIG. 12 is one formed to be in a form of a trapezoid. In this case, that shape is formed by giving no exposure to the area of protrusion portions 24. Protrusion lacking portions 24*k* are formed at two locations to be in a form of a circle and a form of an elongated circle in the direction of a long side, and corresponding transparent member is positioned by cylindrical bosses at two locations representing protruded portions for poisoning.

Figure 13:
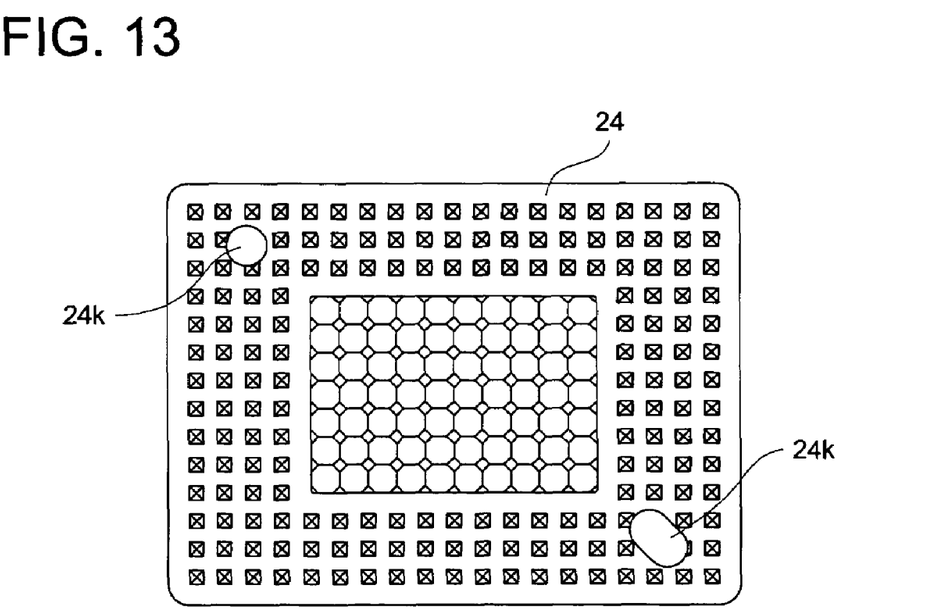
FIG. 13 is a diagram showing still another example of a shape of protrusion portions formed to be solid with a micro-lens array.

The shape of protrusion portion 24 shown in FIG. 13 is one formed to be in a form of a waffle. Protrusion lacking portions 24*k* are formed at two locations to be in a form of a circle and a form of an elongated circle in the diagonal direction.

A combination of a sectional shape of a protrusion portion and a protrusion lacking portion is not limited to the foregoing, and they may be combined freely.

What is claimed is:

1. A solid-state image pickup apparatus comprising:
    a light receiving pixel group comprising two-dimensionally arranged light receiving pixels to convert photoelectrically incident light;
    a microlens array two-dimensionally arranged to correspond in position to the light receiving pixels;
    a transparent member arranged on a light entering side of the microlens array, the transparent member comprising at least one protruded portion;
    a plurality of protrusions supporting the transparent member; and
    at least one protrusion lacking portion that engages the at least one protruded portion on the transparent member;
    wherein the plurality of protrusions are formed as a plurality of higher microlenses integrated with the microlens array from a same thermoplastic transparent photosensitive resin film;
    wherein each of the higher microlenses is higher than the microlens array.

2. The solid-state image pickup apparatus of claim 1, wherein the higher microlenses are formed to be integrated with the microlens array using a same process.

3. The solid-state image pickup apparatus of claim 2, wherein the process is provided by a lithography technique.

4. The solid-state image pickup apparatus of claim 3, wherein the process provided by the lithography technique for use in a producing method of a microlens array arranged in the solid-state image pickup apparatus comprises:
a process of exposing the thermoplastic transparent photosensitive resin film with a mask where an exposing pattern on a region where the microlens array is formed is different in size from another exposing pattern on a region where the higher microlenses are formed so that the higher microlenses and the microlens array are formed from and integrated in the thermoplastic transparent photosensitive resin film by the exposing step.

5. The solid-state image pickup apparatus of claim 4, wherein the process of forming the transparent photosensitive resin film is provided by a coating technique.

6. The solid-state image pickup apparatus of claim 4, wherein the exposed transparent photosensitive resin film is developed by etching.

7. The solid-state image pickup apparatus of claim 4, wherein the process of forming the microlens array and the higher microlenses is provided by a heat reflow method or an etchback method.

8. The solid-state image pickup apparatus of claim 1, wherein the higher microlenses are arranged in an area surrounding the microlens array, the at least one protrusion lacking portion being defined within the area.

9. The solid-state image pickup apparatus of claim 1, wherein the transparent member contacts and adheres to the higher microlenses and seals a space where the microlens array is arranged.

10. The solid-state image pickup apparatus of claim 1, wherein the transparent member is molded member.

11. The solid-state image pickup apparatus of claim 1, wherein the transparent member comprises an infrared light blocking function.

12. The solid-state image pickup apparatus of claim 1, further comprising a transparent member protrusion or a transparent member recess formed on a part of a light entering surface of the transparent member.

13. The solid-state image pickup apparatus of claim 1, wherein the transparent member comprises a light shielding portion.

14. The solid-state image pickup apparatus of claim 1, wherein antireflective processing is conducted on at least one surface of the transparent member.

15. The solid-state image pickup apparatus of claim 1 wherein an optical low pass filter is arranged on at least one surface on the transparent member.

16. An image pickup apparatus comprising:
a solid-state image pickup apparatus of claim 1; and
an image pickup optical system to focus a subject light on the solid-state image pickup apparatus;
wherein the solid-state image pickup apparatus comprises:
a two-dimensionally arranged light receiving pixel group comprising light receiving pixels to convert photoelectrically incident light;
a microlens array two-dimensionally arranged to correspond in position to the light receiving pixels;
a transparent member arranged on a light entering side of the microlens array; and
a plurality of protrusions supporting the transparent member;
wherein the plurality of protrusions are formed as a plurality of higher microlenses integrated with the microlens array from a same thermoelastic transparent photosensitive resin film; and
wherein each of the higher microlenses is higher than the microlens array.

17. The image pickup apparatus of claim 16 wherein the image pickup optical system contacts a light entering surface of the transparent member.

* * * * *